United States Patent
Jiang et al.

(10) Patent No.: US 7,687,109 B2
(45) Date of Patent: *Mar. 30, 2010

(54) APPARATUS AND METHOD FOR MAKING CARBON NANOTUBE ARRAY

(75) Inventors: Kai-Li Jiang, Beijing (CN); Kai Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 417 days.

This patent is subject to a terminal disclaimer.

(21) Appl. No.: 11/371,997

(22) Filed: Mar. 8, 2006

(65) Prior Publication Data

US 2006/0269669 A1    Nov. 30, 2006

(30) Foreign Application Priority Data

Mar. 18, 2005    (CN) .................. 2005 1 0033733

(51) Int. Cl.
- *C23C 16/00* (2006.01)
- *C01B 31/02* (2006.01)
- *C01B 31/00* (2006.01)
- *D01C 5/00* (2006.01)

(52) U.S. Cl. ............... 427/248.1; 427/249.1; 427/903; 423/447.3; 423/445 R

(58) Field of Classification Search ............. 427/248.1; 423/447.3
See application file for complete search history.

(56) References Cited

U.S. PATENT DOCUMENTS

| 5,374,415 A | 12/1994 | Alig et al. |
| 6,177,292 B1 | 1/2001 | Hong et al. |
| 6,232,706 B1 | 5/2001 | Dai et al. |

(Continued)

FOREIGN PATENT DOCUMENTS

CN    1266018    9/2000

(Continued)

OTHER PUBLICATIONS

Cassell et al., Large scale CVD synthesis of Single Walled Carbon Nanotubes, Jun. 1, 1999, J. Phys. Chem. B 103, 6484-6492.*

(Continued)

*Primary Examiner*—Timothy H Meeks
*Assistant Examiner*—Mandy C Louie
(74) *Attorney, Agent, or Firm*—D. Austin Bonderer

(57) ABSTRACT

An apparatus for making an array of carbon nanotubes includes a reaction chamber with a gas inlet and a gas outlet; a quartz boat disposed in the reaction chamber; a substrate with a surface deposited with a film of first catalyst, the substrate being disposed in the quartz boat; and a second catalyst disposed in the quartz beside the substrate. A method for making an array of carbon nanotubes, comprising the steps of: (a) providing a substrate with a surface deposited with a film of first catalyst; (b) disposing a second catalyst beside the substrate to produce small amounts of hydrogen gas which flows to the first catalyst; (c) introducing a carrier gas and a carbon source gas flowing from the second catalyst to the first catalyst at a predetermined temperature; and (d) growing an array of carbon nanotubes extending from the substrate.

19 Claims, 3 Drawing Sheets

U.S. PATENT DOCUMENTS

| | | | |
|---|---|---|---|
| 6,315,977 | B1 | 11/2001 | Cantacuzene |
| 6,350,488 | B1 | 2/2002 | Lee et al. |
| 6,569,765 | B1 | 5/2003 | Solomon et al. |
| 6,627,552 | B1 | 9/2003 | Nishio et al. |
| 6,656,285 | B1 | 12/2003 | Melnik et al. |
| 6,706,119 | B2 | 3/2004 | Tsvetkov et al. |
| 6,768,135 | B2 | 7/2004 | Solomon et al. |
| 6,811,814 | B2 * | 11/2004 | Chen et al. ............... 427/248.1 |
| 6,936,357 | B2 | 8/2005 | Melnik et al. |
| 7,214,360 | B2 | 5/2007 | Chen et al. |
| 7,276,121 | B1 | 10/2007 | Bliss et al. |
| 7,279,047 | B2 | 10/2007 | Melnik et al. |
| 7,288,321 | B2 * | 10/2007 | Liu et al. .................... 428/408 |
| 2002/0132495 | A1 * | 9/2002 | Siegel et al. ................ 438/778 |
| 2002/0172767 | A1 * | 11/2002 | Grigorian et al. ...... 427/255.28 |
| 2003/0039750 | A1 | 2/2003 | Mao et al. |
| 2004/0105807 | A1 | 6/2004 | Fan et al. |
| 2004/0136896 | A1 | 7/2004 | Liu et al. |
| 2004/0253167 | A1 | 12/2004 | Silva et al. |
| 2005/0046322 | A1 * | 3/2005 | Kim et al. ................... 313/309 |
| 2005/0089467 | A1 | 4/2005 | Grill et al. |
| 2005/0112051 | A1 * | 5/2005 | Liu et al. ................. 423/447.1 |
| 2005/0271829 | A1 * | 12/2005 | Kumar et al. ............... 427/569 |
| 2006/0269669 | A1 * | 11/2006 | Jiang et al. ............... 427/249.1 |

FOREIGN PATENT DOCUMENTS

| | | | |
|---|---|---|---|
| JP | 2000281304 | * | 10/2000 |
| JP | 2000281304 A | | 10/2000 |
| JP | 2004250306 A | | 9/2004 |

OTHER PUBLICATIONS

Li, W Z et. al., Large-scale synthesis of aligned carbon nanotubes, Science, 274, 1701-1703.

Moshkalyov et al., Carbon nanotubes growth by chemical vapor deposition using thin film nickel catalyst, Sep. 25,2004, Materials Science and Engineering B, vol. 112, Issues 2-3, pp. 147-153.

* cited by examiner

APPARATUS AND METHOD FOR MAKING CARBON NANOTUBE ARRAY

RELATED APPLICATIONS

This application is related to commonly-assigned applications entitled, "METHOD FOR MAKING CARBON NANOTUBE ARRAY", Mar. 8, 2006 application Ser. No. 11/371,993 "APPARATUS FOR MAKING CARBON NANOTUBE ARRAY", filed Mar. 8, 2006 Ser. No. 11/371, 992, and "METHOD FOR MAKING CARBON NANOTUBE ARRAY", filed Mar. 8, 2006 application Ser. No. 11/371,993. Disclosures of the above -identified applications are incorporated herein by reference.

BACKGROUND

1. Technical Field

The invention relates generally to apparatuses and methods for making carbon nanotubes, and more particularly to an apparatus and a method for making an array of carbon nanotubes.

2. Discussion of Related Art

Carbon nanotubes were discovered by S. Iijima in 1991, they are very small tube-shaped structures, each essentially having composition similar to that of a graphite sheet rolled into a tube. Theoretical studies showed that carbon nanotubes exhibit either metallic or semiconductive behavior depending on the radii and helicity of the tubules. Carbon nanotubes have interesting and potentially useful electrical and mechanical properties, and have many potential uses in electronic devices. Carbon nanotubes also feature extremely high electrical conductivity, very small diameters (much less than 100 nanometers), large aspect ratios (i.e. length/diameter ratios greater than 1000), and a tip-surface area near the theoretical limit (the smaller the tip-surface area, the more concentrated the electric field, and the greater the field enhancement factor). These features make carbon nanotubes ideal candidates for electron field emitters, white light sources, lithium secondary batteries, hydrogen storage cells, transistors, and cathode ray tubes (CRTs).

Generally, there are three methods for manufacturing carbon nanotubes. The first method is the arc discharge method, which was first discovered and reported in an article by Sumio Iijima entitled "Helical Microtubules of Graphitic Carbon" (Nature, Vol. 354, Nov. 7, 1991, pp. 56-58). The second method is the laser ablation method, which was reported in an article by T. W Ebbesen et al. entitled "Large-scale Synthesis of Carbon Nanotubes" (Nature, Vol. 358, 1992, pp. 220). The third method is the chemical vapor deposition (CVD) method, which was reported in an article by W. Z. Li entitled "Large-scale Synthesis of Aligned Carbon Nanotubes" (Science, Vol. 274, 1996, pp. 1701).

In the arc discharge method, a carbon vapour is created by an arc discharge between two carbon electrodes either with or without a catalyst. Carbon nanotubes self-assemble from the resulting carbon vapour. In the laser ablation technique, high-powered laser pulses impinge on a volume of carbon-containing feedstock gas (methane or carbon monoxide). Carbon nanotubes are thus condensed by the laser ablation and are deposited on an outside collector. However, the carbon nanotubes produced by the arc discharge and the laser ablation vary greatly in diameter and length, with little control over the dimensions of the resulting product. Moreover, poor carbon nanotube yield and prohibitive cost involved in making the device mean that the two methods difficult to scale up to suit industrial production.

In the chemical vapour deposition (CVD) method, carbon filaments and fibers are produced by thermal decomposition of a hydrocarbon gas on a transition metal catalyst in a chemical vapour deposition reaction chamber. In general, the chemical vapour deposition process results in both multi-walled nanotubes (MWNTs) and single-walled nanotubes (SWNTs) being produced. Compared with the arc discharge method and laser ablation method, the chemical vapour deposition method is a more simple process and can easily be scaled up for industrial production. However, the carbon nanotubes manufactured by the chemical vapour deposition process aren't bundled to form an array, thus the CVD process can't assure both quantity and quality of production.

In view of the above, another method, such as a thermal chemical vapor deposition method is disclosed where an array of carbon nanotubes are formed vertically aligned on a large-size substrate. The thermal CVD method includes the steps of: forming a metal catalyst layer on a substrate; etching the metal catalyst layer to form isolated nano-sized catalytic metal particles; growing carbon nanotubes from said isolated nano-sized catalytic metal particles by the thermal chemical vapor deposition (CVD) process; and purifying the carbon nanotubes in-situ.

The carbon nanotubes formed by the above-described methods are vertically aligned on the substrate. However, the devices used in above-described method are complicated. Several gas inlets are disposed in the device for introducing different gases. Also the carbon nanotubes formed by the above-described devices and methods are generally comprised of a mix of MWNTs and SWNTs. The mixed carbon nanotubes do not sufficiently exhibit the useful properties of a single-type array of carbon nanotubes. Furthermore, excess amorphous carbon lumps and metal catalyst lumps are also produced along with the carbon nanotubes formed by the above-described devices and methods and adhere to inner or outer sidewalls of the carbon nanotubes. Thus, a complicated purification device and method is required in addition to the above-described devices methods. Moreover, the devices used in the above-described method generally operate at temperatures in the range from 700° C. to 1000° C. for growing carbon nanotubes, thus requiring a highly heat-resistant reaction chamber. Therefore, the devices in the above-described method for making the carbon nanotubes are limited.

What is needed, therefore, is an apparatus and a method for making an array of carbon nanotubes that is easy to operate and has a simple structure and process for forming a high pure carbon nanotube array.

SUMMARY

An apparatus for making an array of carbon nanotubes includes a reaction chamber. The reaction chamber has a gas inlet and a gas outlet. The gas inlet is configured for introducing a carbon source gas and a carrier gas thereinto. A substrate is disposed in the reaction chamber. The substrate has a layer of first catalyst provided thereon. The reaction chamber defines a first route for the introduced carbon source gas to flow toward the substrate. A second catalyst is disposed on the route and is configured to react with the carbon source gas thereby producing a resultant gas which promotes catalytic activity on the first catalyst.

An apparatus for making an array of carbon nanotubes includes a reaction chamber and a tubular boat. The reaction chamber has a gas inlet and a gas outlet. The gas inlet is configured for introducing a carbon source gas and a carrier gas thereinto. A substrate is disposed in the reaction chamber. The substrate has a layer of first catalyst provided thereon. A second catalyst is configured for reaction with the carbon source gas thereby producing a resultant gas which promotes the catalytic activity of the first catalyst. The tubular boat is configured for receiving the substrate and the second catalyst therein. The tubular boat has an open end configured for introducing the carbon source gas and an opposite closed end configured for blocking and directing the introduced carbon source gas in the boat towards the substrate. The second catalyst is disposed in the boat in a manner to enable the resultant associated with the second catalyst to forcedly flow toward the substrate.

A method for making an array of carbon nanotubes includes the steps of:

(a) providing a substrate with a film of first catalyst thereon;

(b) disposing a second catalyst adjacent to the substrate;

(c) introducing a carrier gas and a carbon source gas in a manner that the carbon source gas flows from the second catalyst to the first catalyst; and (d) growing an array of carbon nanotubes on the substrate.

Compared with conventional CVD devices and methods for making carbon nanotube arrays, the apparatus and method in the described embodiments have the following advantages. Firstly, the present device and method can be used at a relatively low temperature, for example, in the range from 600 to 700° C. In the preferred embodiments of the apparatus and method, an array of bundled and super-aligned carbon nanotubes can be synthesized at temperatures in the range from 620 to 690° C. Secondly, growth speed and yield of carbon nanotubes are both improved. After growing carbon nanotubes for 30 to 60 minutes, the array of the carbon nanotubes has a height of a few hundred micrometers to a few millimeters. Thirdly, the present device and method for growing carbon nanotubes is inexpensive. A carrier gas and a carbon source gas of the preferred method can be inexpensive argon and acetylene. A catalyst can be inexpensive iron. Furthermore, usage of a second catalyst in accordance with the present apparatus and method can avoid using expensive hydrogen in the method. That is, the danger and cost of the present apparatus and method are relatively low compared to conventional methods.

Other advantages and novel features of the present apparatus and method for making an array of carbon nanotubes will become more apparent from the following detailed description of preferred embodiments, when taken in conjunction with the accompanying drawings.

BRIEF DESCRIPTION OF THE DRAWINGS

Many aspects of the present apparatus and method for making an array of carbon nanotubes can be better understood with reference to the following drawings. The components in the drawings are not necessarily to scale, the emphasis instead being placed upon clearly illustrating the principles of the present apparatus and method for making an array of carbon nanotubes.

Figure 1:
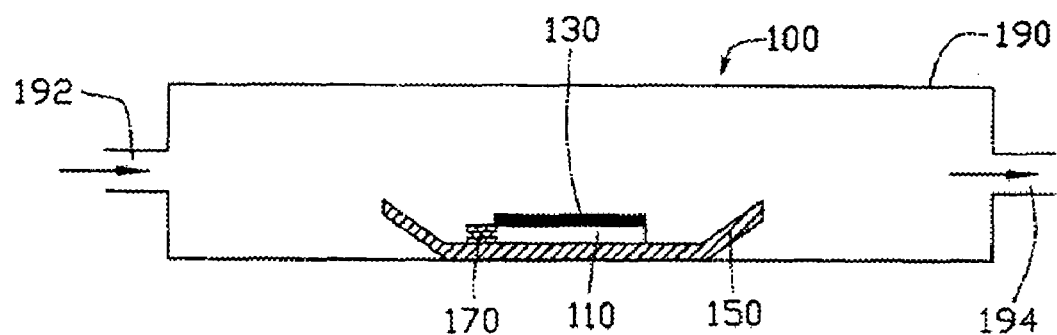
FIG. 1 is a schematic, cutaway view of an apparatus for making an array of carbon nanotubes in accordance with a first embodiment of the present invention.

Corresponding reference characters indicate corresponding parts throughout the several views. The exemplifications set out herein illustrate at least one preferred embodiment of the present apparatus and method for making an array of carbon nanotubes, in one form, and such exemplifications are not to be construed as limiting the scope of the invention in any manner.

DETAILED DESCRIPTION OF PREFERRED EMBODIMENTS

Reference will now be made to the drawings to describe embodiments of the present apparatus and method for making an array of carbon nanotubes, in detail.

Figure 2:
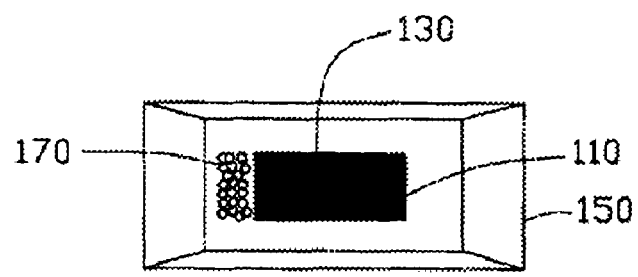
FIG. 2 is a top view of a quartz boat with a substrate and a second catalyst thereon of FIG. 1.

Referring to FIGS. 1 and 2, an apparatus 100 in accordance with a first embodiment of the present device is provided. The apparatus 100 includes a reaction chamber 190, a quartz boat 150, a substrate 110, a first catalyst 130 and a second catalyst 170. The reaction chamber 190 can be a tubular container. A gas inlet 192 and a gas out let 194 are located at two opposite ends of the reaction chamber 190 respectively. In the preferred embodiment, the gas inlet 192 is for introducing a carrier gas and a carbon source gas. The quartz boat 150 is disposed in the reaction chamber 190. The quartz boat 150 can be opened at two opposite ends. In the preferred embodiment, the quartz boat 150 is cymbiform. Alternatively, the quartz boat 150 could be made by other suitable materials. The substrate 110 is disposed on the bottom of the quartz boat 150. The film of catalyst 130 is uniformly disposed on the surface of the substrate 110 by means of chemical vapor deposition, thermal deposition, electron-beam deposition, or sputtering. The first catalyst 130 can be made of iron (Fe), cobalt (Co), nickel (Ni), or any combination alloy thereof. In the preferred embodiment, the first catalyst 130 is made of iron. The second catalyst 170 is disposed proximate to the substrate 110. The second catalyst 170 and the substrate 110 are disposed on the bottom of the quartz boat 150. The second catalyst 170 is placed beside one side of the substrate 110. The second catalyst 170 can be either metallic powder or netting made of iron, nickel or alumina. In the preferred embodiment, the second catalyst 170 is iron powder. In the first embodiment, a first route is defined in the reaction chamber 190 for the introduced carbon source gas flow from the second catalyst 170 toward the substrate 110. The second catalyst 170 is disposed on the route. The second catalyst 170 can pyrolize the introduced carbon source gas to produce a small amount of hydrogen gas which then flows toward the substrate 110. In the preferred embodiment, the second catalyst 170 is disposed proximate to one side of the substrate 110 facing the gas inlet 192. The additional hydrogen activates the first catalyst 130 and reduces the concentration of carbon source gas around the first catalyst 130. Therefore, the growth speed of the carbon nanotubes is increased and the height of the array of the carbon nanotubes is enhanced. In addition, advantageously, the hydrogen produced by the second catalyst 170 and the carbon source gas can reach the first catalyst 130 along the route and activate the first catalyst 130 to improve the growing speed of the carbon nanotubes.

Figure 3:
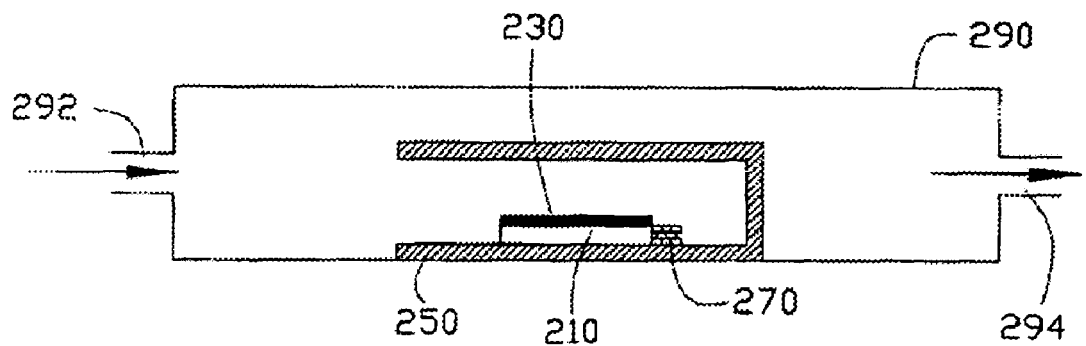
FIG. 3 is a schematic, cutaway view of an apparatus for making an array of carbon nanotubes in accordance with a second embodiment of the present invention.
Figure 4:
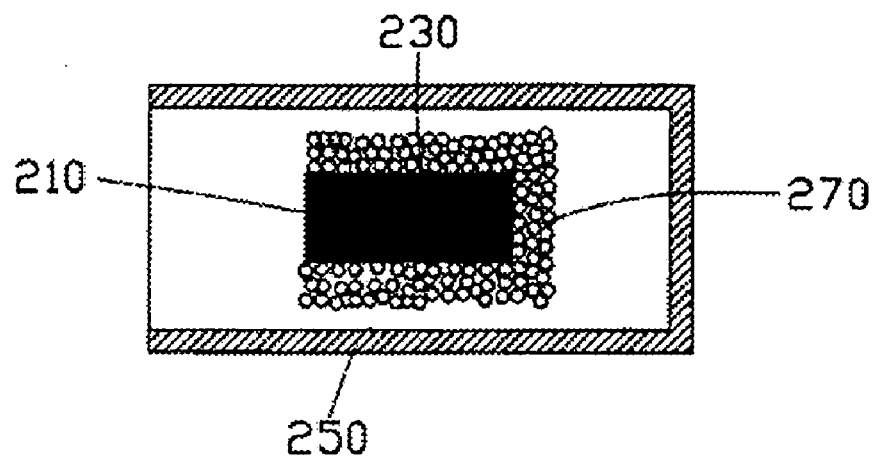
FIG. 4 is a cross-sectional, top view of a quartz boat of FIG. 3.
Figure 5:
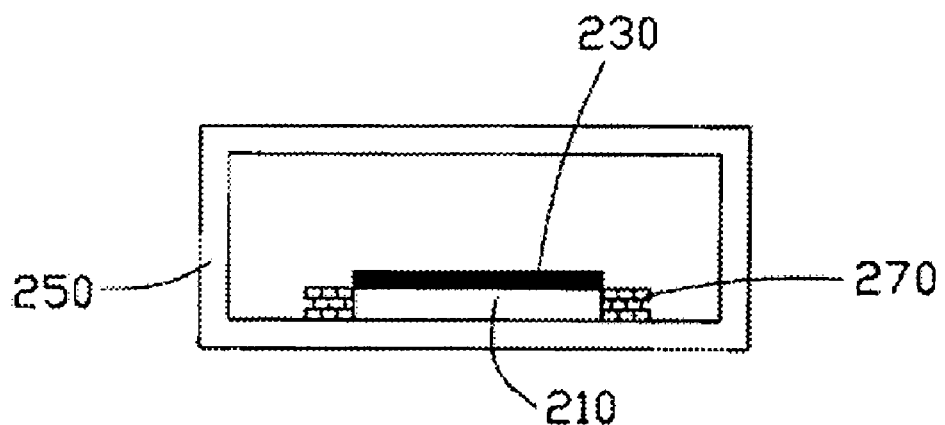
FIG. 5 is a side view of the quartz boat of FIG. 3.

Referring to FIGS. 3, 4 and 5, an apparatus 200 in accordance with a second embodiment of the present device is provided. The apparatus 200 includes a reaction chamber 290, a quartz boat 250, a substrate 210, a first catalyst 230 and a second catalyst 270. The reaction chamber 290 can be a tubular container. A gas inlet 292 and a gas out let 294 are located at two ends of the reaction chamber 290 respectively. In the preferred embodiment, the gas inlet 292 is for introducing a carrier gas and a carbon source gas. The quartz boat 250 is disposed in the reaction chamber 290. The quartz boat 250 includes an open end. In the preferred embodiment, the quartz boat 250 is tubular with one open end facing towards the gas inlet 292. The substrate 210 is disposed in the quartz boat 250. The film of first catalyst 230 is uniformly disposed on the surface of the substrate 210 by means of chemical vapor deposition, thermal deposition, electron-beam deposition, or sputtering. The first catalyst 130 can be made of iron (Fe), cobalt (Co), nickel (Ni), or any combination alloy thereof. In the preferred embodiment, the first catalyst 230 is made of iron. The second catalyst 270 is disposed proximate to the substrate 110. The quartz boat 250 includes a bottom and at least one sidewall extending from the bottom, the second catalyst 270 is disposed on the bottom and between the substrate 210 and the at least one sidewall of the quartz boat 250. The second catalyst 270 and the substrate 210 are disposed on the bottom of the quartz boat 250. The second catalyst 270 can be either metallic powder or metal netting made of iron, nickel or alumina. In the preferred embodiment, the second catalyst 270 is iron powder. In the second embodiment, a second route is defined in the quartz boat 250 for the introduced carbon source gas flow from the second catalyst 270 toward the substrate 210. The second catalyst 270 is disposed beside three sides of the substrate 210 far from the gas inlet 292. The second catalyst 270 pyrolizes the carbon source gas to produce small quantities of hydrogen gas which flows towards the first catalyst 230. The additional hydrogen activates the first catalyst 230 and reduces the concentration of carbon source gas around the first catalyst 230. Therefore, the growth speed of the carbon nanotubes is increased and the height of the array of the carbon nanotubes is improved. In addition, advantageously, the hydrogen produced by the second catalyst 270 and the carbon source gas can reach the first catalyst 230 along the second route and activate the first catalyst 230 to improve the growing speed of the carbon nanotubes.

A preferred method for making an array of carbon nanotubes using the present apparatus is provided. In the preferred embodiment, the method is based on the first embodiment and includes the following steps in no particularly order thereof. Firstly, a substrate 110 with a surface is provided, and a film of first catalyst 130 is formed on a surface of the substrate 110. The film of first catalyst 130 is uniformly disposed on the substrate 110 by means of chemical vapor deposition, thermal deposition, electron-beam deposition, or sputtering.

Secondly, a quartz boat 150 and a second catalyst 170 are provided. The second catalyst 170 and the substrate 110 are disposed on a bottom of the quartz boat 150. The second catalyst 170 is disposed proximate to the substrate 110.

Thirdly, a horizontal reaction chamber 190 with a gas inlet 192 and a gas outlet 194 is provided. The gas inlet 192 is for introducing a carrier gas and a carbon source gas. The quartz boat 150 is disposed on a bottom of the reaction chamber 190. A first route is defined in the reaction chamber 190 for the introduced carbon source gas flow from the second catalyst 170 to the substrate 110. The second catalyst 170 and the substrate 110 are disposed on the route. In the preferred embodiment, the second catalyst 170 is disposed proximate to at least one side of the substrate 110 far from the gas outlet 194.

Fourthly, a carrier gas is continuously introduced into the reaction chamber 19 from the gas inlet 192 at one atmosphere of pressure. The carrier gas is used to create an atmosphere of inert gas in the reaction chamber 19. Then, the reaction chamber 19 is heated gradually to a predetermined temperature. A carbon source gas which mixes with the carrier gas is introduced into the reaction chamber 19 from the gas inlet 192. The carrier gas can be a nitrogen ($N_2$) gas or a noble gas. The carbon source gas can be ethylene ($C_2H_4$), methane ($CH_4$), acetylene ($C_2H_2$), ethane ($C_2H_6$) or any combination thereof. In the preferred embodiment, the carrier gas is argon (Ar), the carbon source gas is acetylene. A ratio of the carrier gas flow-rate to the carbon source gas flow-rate can be adjusted in the range from 5:1 to 10:1. In the preferred embodiment, the argon flow-rate is 300 sccm (Standard Cubic Centimeter per Minute), and the acetylene flow-rate is 30 sccm. The predetermined temperature used in the method can be in the range from 600 to 720° C. In the preferred embodiment, the predetermined temperature is in the range from 620 to 690° C.

Due to catalyzing by the first catalyst 130, the carbon source gas supplied into the reaction chamber 190 is pyrolized in a gas phase into carbon units (C=C or C) and free hydrogen ($H_2$). The carbon units are absorbed on a free surface of the first catalyst 130 and diffused into the first catalyst 130. When the first catalyst 130 is supersaturated with the dissolved carbon units, carbon nanotube growth is initiated. As the intrusion of the carbon units into the first catalyst 130 continues, an array of carbon nanotubes is formed. The array of the carbon nanotubes formed by the preferred embodiment is a multi-walled carbon nanotube array. Density, diameter and length of the multi-walled carbon nanotube array can be controlled by adjusting the flow rates of the carbon source gas and the carrier gas, and by altering the predetermined temperature and the reaction time. In addition, the second catalyst 170 used in the first embodiment can act on the carbon source gas. The second catalyst 170 can pyrolize the carbon source gas to produce a small amounts of hydrogen gas which flows to the first catalyst 130. The additional hydrogen produced by the second catalyst 170 can activate the first catalyst 130, and further reduce the concentration of the carbon source gas around the first catalyst 30. As such, the growth speed of the carbon nanotubes is increased and the height of the array of the carbon nanotubes is enhanced. In the preferred first embodiment, the reaction time is in the range from 30 to 60 minutes. The synthesis method can produce carbon nanotubes with a length greater than 3-400 micrometers, and have a diameter in the range from 10 to 30 nanometers.

Figure 6:
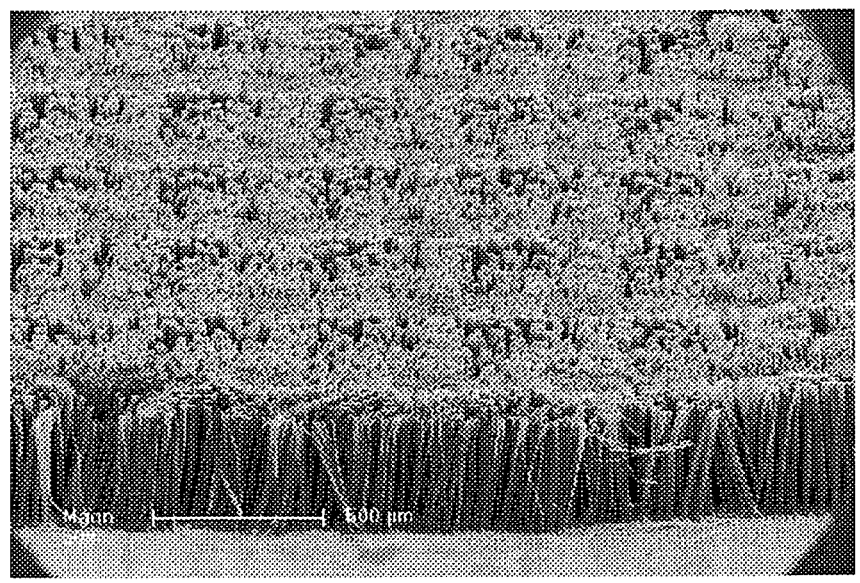
FIG. 6 shows a Scanning Electron Microscope (SEM) image of the array of carbon nanotubes formed by the apparatus of FIG. 1.
Figure 7:
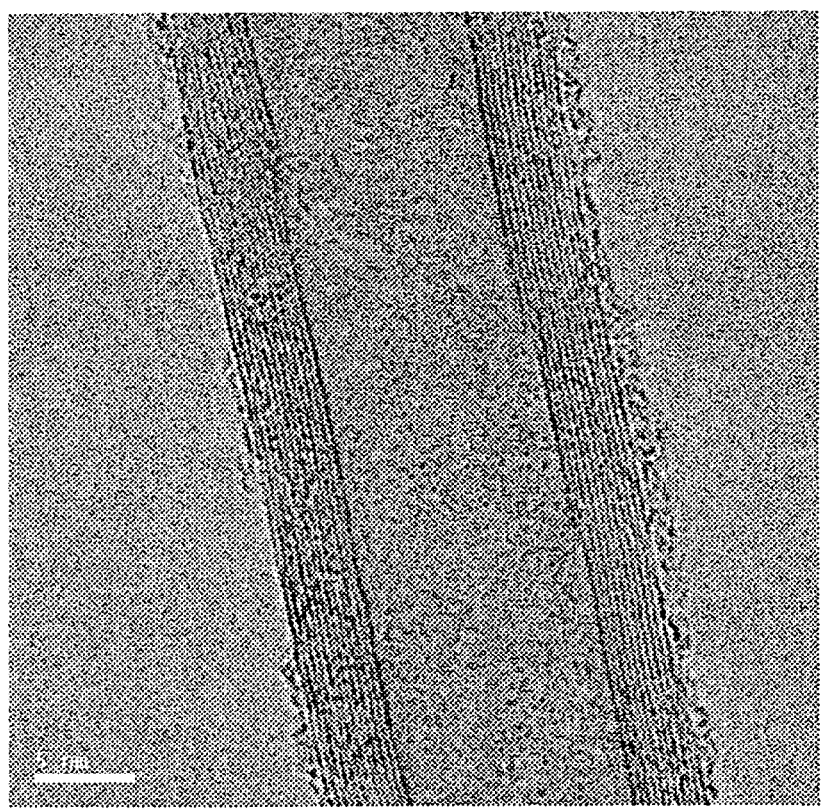
FIG. 7 shows a Transmission Electron Microscope (TEM) image of the array of carbon nanotubes formed by the apparatus of FIG. 1.

Referring to FIGS. 6 and 7, an SEM image and a TEM image of the multi-walled carbon nanotube array formed by the present device are shown. It can be seen that the carbon nanotubes in the array of the carbon nanotubes are highly bundled and super-aligned. The height of the array of the carbon nanotubes is about 300 micrometers.

In the present apparatus and method, the second catalyst 170, 270 can be metallic powder or netting made of pure iron or nickel. During the synthesis process of the array of the carbon nanotubes, the second catalyst 170, 270 pyrolizes the carbon source gas to produce small amounts of hydrogen. The hydrogen can activate the first catalyst 130, 230 and reduce the consistency of the carbon source gas around the first catalyst 130, 230. As such, the growth speed of the carbon nanotubes is improved and the height of the array of the carbon nanotubes can be from a few hundred micrometers to a few millimeters.

In the preferred methods, the method for making the second catalyst 170, 270 powder includes the following steps in no particular order thereof. Firstly, a powder of about 11.32 grams of ferric nitrate and about 8 g of alumina are immersed in an ethanol solution of 100 milliliters. Secondly, the mixture solution is stirred for about eight hours, and then vaporized by a revolving evaporator for about 12 hours at a temperature of about 80° C. Thirdly, the remainder after vaporizing is ball milled to produce a second catalyst powder. In addition, the second catalyst 170, 270 powder used in the present apparatus and method can be recycled. After the synthesis process of the array of the carbon nanotubes, the second catalyst 170, 270 powder can be collected from the quartz boat 150, 250. Then, the collected powder can be burned in an oxygen atmosphere to remove the carbon nanotubes and amorphous carbon which adhere to the second catalyst 170, 270. As such, the second catalyst 170, 270 powder can be used many times and thus the use of the second catalyst adds almost no additional cost.

Furthermore, it is noted that, the shape of the quartz boat of the present apparatus can be varied. The disposed place of the second catalyst relates to the shape of the quartz boat and the direction of the gas flowing in the quartz boat. In particularly, when the quartz boat is cymbiform including two opposite open ends with one end facing towards the gas inlet and the other facing towards the gas outlet of the reaction chamber (referring to the first embodiment of the present apparatus), the second catalyst is disposed beside at least one side of the substrate far from the gas outlet. Alternatively, when the quartz boat is tubular including one open end facing to the gas inlet (referring to the second embodiment of the present apparatus), the second catalyst is disposed beside at least one side of the substrate far from the gas inlet. Furthermore, because the purpose of adopting the second catalyst in accordance with the present apparatus and method is providing small amounts of additional hydrogen gas around the film of first catalyst, the disposing of the second catalyst should obey the following conditions. Firstly, that the second catalyst should be disposed beside the substrate to assure that the produced hydrogen by the second catalyst can act on the first catalyst directly. Secondly, that the second catalyst should be disposed in front of the substrate along a direction of gas flow that ensures that the hydrogen produced by the second catalyst can reach the first catalyst. Also, it is to be understood that the second catalyst should be placed within the range of protection of the present apparatus and methods.

It is noted that, the reaction chamber of the present apparatus includes apparatuses for use in chemical vapor deposition, such as horizontal CVD devices, vertical CVD devices and a CVD device with a removable quartz boat. Moreover, the present apparatus and method can synthesize massive carbon nanotube arrays by disposing a plurality of substrate in the reaction chamber simultaneously, and that the property of carbon nanotubes thus produced is essentially uniform. Thus, both quality and production of the carbon nanotubes can be controlled by the present apparatus and method. Furthermore, the film of first catalyst of the present apparatus and method can be patterned for growing patterned carbon nanotube array.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

We claim:

1. A method for making an array of carbon nanotubes, comprising the steps of:
    (a) providing a substrate with a film of a first catalyst thereon and a second catalyst adjacent to the substrate;
    (c) introducing a carbon source gas along a route in which the carbon source gas flows past the first catalyst first to the second catalyst and then back to the first catalyst;
    (e) activating the first catalyst with a product of the second catalyst and the carbon source gas; and
    (d) growing an array of carbon nanotubes on the substrate.

2. The method as claimed in claim 1, wherein a carrier gas is introduced at a flow rate that is five to ten times greater than that of the carbon source gas.

3. The method as claimed in claim 2, wherein the carrier gas comprises of a gas selected from the group consisting of nitrogen gas and noble gas.

4. The method as claimed in claim 1, wherein the carbon source gas is selected from the group consisting of ethylene, methane, acetylene and ethane.

5. The method as claimed in claim 1, wherein step (c) is performed at a temperature in the range of 600 to 720° C.

6. The method as claimed in claim 1, wherein in step (c), the carbon source gas is introduced for 30 to 60 minutes.

7. The method as claimed in claim 1, wherein the substrate and the second catalyst are disposed in a quartz boat which is located in a reaction chamber.

8. The method as claimed in claim 7, wherein a pressure in the reaction chamber is maintained at one atmospheric pressure.

9. The method as claimed in claim 1, wherein the second catalyst consists of iron, nickel and alumina.

10. The method as claimed in claim 1, wherein the first catalyst comprises of a material selected from the group consisting of iron, cobalt, nickel and combinations thereof.

11. The method as claimed in claim 1, wherein the second catalyst has less uniformity than the film of the first catalyst.

12. The method as claimed in claim 1, wherein the second catalyst is in the form of powder or netting.

13. A method for making an array of carbon nanotubes, comprising the steps of:
    (a) disposing a substrate and a second catalyst on a quartz boat in a manner that the substrate and the second catalyst both are in contact with a surface of the quartz boat, the substrate including a film of a first catalyst thereon, and placing the quartz boat into a reaction chamber;
    (b) introducing a carbon source gas along a route in which the carbon source gas flows past the first catalyst first to the second catalyst and then back to the first catalyst;
    (c) activating the first catalyst with a resultant product of a reaction between the second catalyst and the carbon source gas; and
    (d) growing the array of carbon nanotubes from the first catalyst on the substrate.

14. The method as claimed in claim 13, wherein the second catalyst is in the form of powder or netting.

15. The method as claimed in claim 13, wherein the second catalyst is less uniform than the film of the first catalyst.

16. The method as claimed in claim 13, wherein a carrier gas is introduced at a flow rate that is five to ten times greater than that of the carbon source gas.

17. A method for making an array of carbon nanotubes, comprising the steps of:
    (a) providing a substrate including a top surface, a bottom surface opposite to the top surface, and a side surface between the top surface and the opposite bottom surface, the substrate with a film of a first catalyst on the top surface thereof, and arranging a second catalyst adjacent to the substrate such that at least a portion of the second catalyst is touching a portion of the side surface;
    (b) introducing a carbon source gas in a manner that the carbon source gas flows from the second catalyst to the first catalyst; wherein the at least a portion of the second catalyst is touching the portion of the side surface during the entire time the carbon source gas is being introduced;
(c) activating the first catalyst with a resultant product of a reaction between the second catalyst and the carbon source gas; and
(d) growing the array of carbon nanotubes from the first catalyst on the substrate.

18. The method as claimed in claim 17, wherein the second catalyst is less uniform than the film of the first catalyst.

19. The method as claimed in claim 17, wherein the film of the first catalyst covers the entire top surface of the substrate.

* * * * *